(12) United States Patent
Wong et al.

(10) Patent No.: US 8,212,586 B2
(45) Date of Patent: Jul. 3, 2012

(54) UNIVERSAL PINOUT FOR BOTH RECEIVER AND TRANSCEIVER WITH LOOPBACK

(75) Inventors: Thomas S Wong, San Jose, CA (US); David Naren, Campbell, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 12/576,211

(22) Filed: Oct. 8, 2009

(65) Prior Publication Data

US 2011/0084724 A1    Apr. 14, 2011

(51) Int. Cl.
*H01L 25/00*    (2006.01)

(52) U.S. Cl. ............... 326/41; 326/47; 710/12; 710/14; 716/137; 716/138; 716/139

(58) Field of Classification Search ............... 710/8–14; 716/8–10, 116, 118–119, 121, 126, 137–139; 326/37–41, 47

See application file for complete search history.

(56) References Cited

U.S. PATENT DOCUMENTS

| | | | |
|---|---|---|---|
| 5,819,157 A * | 10/1998 | Ben-Efraim et al. | 725/68 |
| 6,130,550 A * | 10/2000 | Zaliznyak et al. | 326/39 |
| 6,661,252 B2 * | 12/2003 | Nagano et al. | 326/37 |
| 7,992,119 B1 * | 8/2011 | Iotov et al. | 716/119 |
| 2008/0109782 A1 * | 5/2008 | Adelman et al. | 716/16 |
| 2009/0292855 A1 * | 11/2009 | Scott et al. | 710/316 |

OTHER PUBLICATIONS

Micrel, Precision Edge SY58023U Datasheet, "Ultra-Low Jitter 2 x 2 Crosspoint Switch w/CML Outputs and Internal I/O Termination", Aug. 2007, pp. 1-2.

* cited by examiner

*Primary Examiner* — Jason M Crawford
(74) *Attorney, Agent, or Firm* — Sawyer Law Group, P.C.

(57) ABSTRACT

An integrated circuit capable of dual configuration of data flow and operable in a plurality of operational modes is provided. The circuit includes eight corner pins, wherein the eight corner pins comprise a first corner pin and a second corner pin on each side of the circuit in each of four side sets, wherein a first corner pin of one side of the circuit is proximate and adjacent to a second corner pin of an adjacent side counterclockwise from the first corner pin and together constitute a paired corner set, each paired corner set comprising a differential input and a differential output.

13 Claims, 3 Drawing Sheets

| SEL1 | SEL0 | Q1 | Q0 | |
|---|---|---|---|---|
| 0 | 0 | IN0 | IN0 | |
| 0 | 1 | IN0 | IN1 | TRANSCEIVER |
| 1 | 0 | IN1 | IN0 | DUAL RECEIVER |
| 1 | 1 | IN1 | IN1 | |

200

300

| SEL1 | SEL0 | Q1 | Q0 | |
|---|---|---|---|---|
| 0 | 0 | IN0 | IN0 | TRANSCEIVER |
| 0 | 1 | IN0 | IN1 | |
| 1 | 0 | IN1 | IN0 | DUAL RECEIVER |
| 1 | 1 | IN1 | IN1 | |

UNIVERSAL PINOUT FOR BOTH RECEIVER AND TRANSCEIVER WITH LOOPBACK

FIELD OF INVENTION

The present invention generally relates to integrated circuit package pinouts for data transmission transceivers, receivers and transmitters.

BACKGROUND OF THE INVENTION

Integrated Circuits are typically packaged in multi-pin, square packages wherein equal numbers of electrical connections reside on all four sides of the package. Several factors influence how the pins of the respective differential input and output pairs are assigned. These include optimizing data flow patterns, minimizing transmission line impedance discontinuities and signal crosstalk. The last two are to assure signal integrity.

Data is transmitted and received electrically through various media such as coax cables, twisted pair lines and printed circuit transmission lines. Unwanted electrical coupling, generally known as cross coupling, between the transmitter and receiver inputs and outputs becomes more of a problem as data rates increase and package size decreases.

A combined transmitter and receiver function is known as a transceiver. Multiple receivers or transmitters can also be integrated in a single package to facilitate data transmission. Other products such as a cross-point switch can be used in a special configuration to achieve this transceiver function. A traditional cross-point switch allows any input to be directed to any single or combination of multiple outputs. The basic structure of a traditional cross-point switch is set forth in FIG. 1.

Accordingly, what is needed is a pinout capable of dual configuration of data flow to operate as a dual receiver or transmitter, or as a transceiver so as to improve signal integrity and provide greater user flexibility.

SUMMARY OF THE INVENTION

An object of the present invention is to provide a package pinout configuration that reduces signal crosstalk, allows input and output line impedance control as package footprint are reduced in size, both of which will lead to improved signal integrity. This package pinout will also allow a transceiver to be used in a dual receive configuration and allow a loopback test configuration, maximizing the user configurability of the device.

An aspect of the present invention comprises an integrated circuit capable of dual configuration of data flow and operable in a plurality of operational modes. The circuit includes eight corner pins, wherein the eight corner pins comprise a first corner pin and a second corner pin on each side of the circuit in each of four side sets, wherein a first corner pin of one side of the circuit is proximate and adjacent to a second corner pin of an adjacent side counterclockwise from the first corner pin and together constitute a paired corner set, each paired corner set comprising a differential input and a differential output.

BRIEF DESCRIPTION OF DRAWINGS

FIG. 2 represents a truth table in accordance with an implementation of the present invention.

DETAILED DESCRIPTION OF PREFERRED EMBODIMENTS

Figure 1:
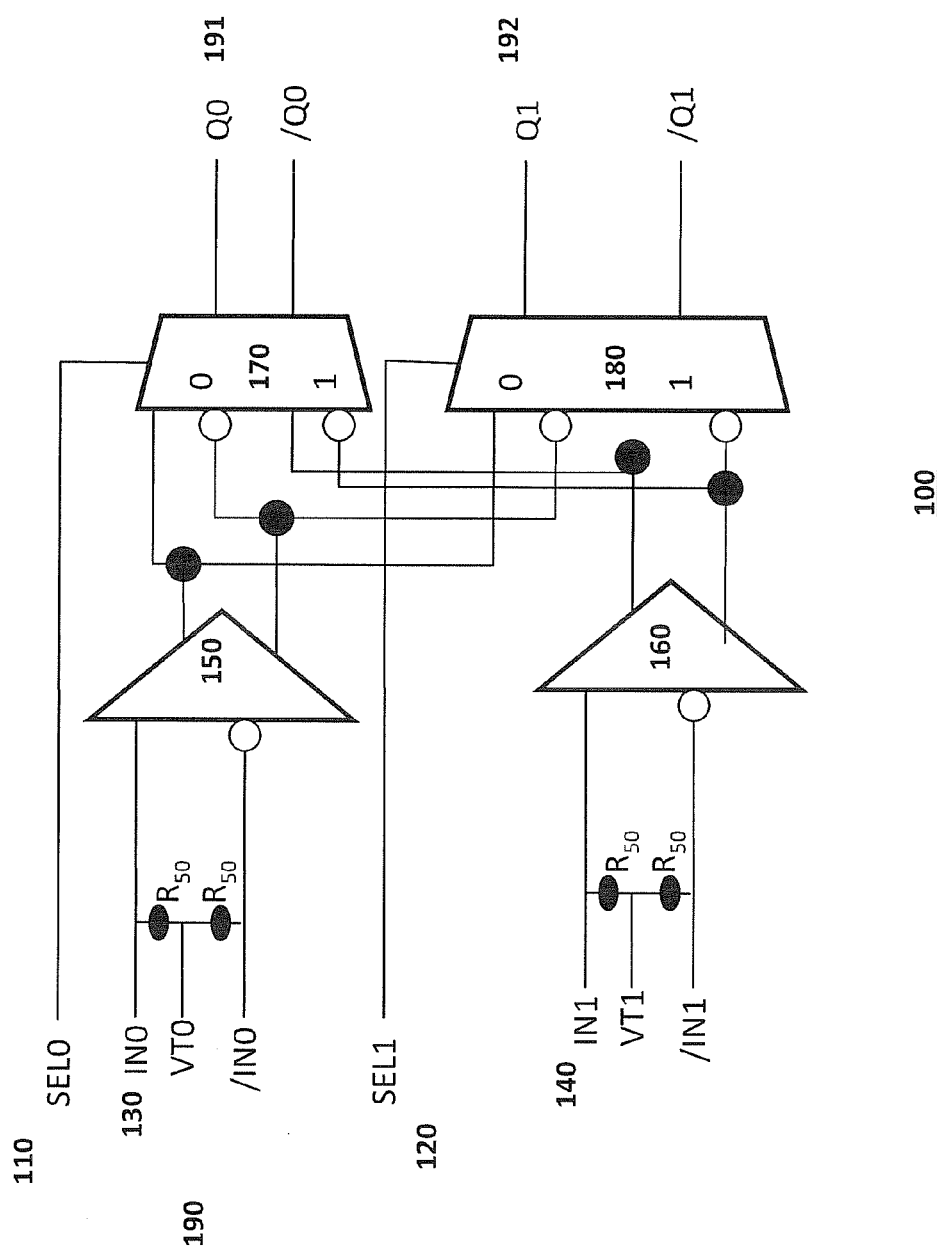
FIG. 1 shows a functional block diagram of a representative pro circuit, in accordance with an implementation of the present invention.

The present invention relates generally to a package pinout that allows for maximum flexibility in implementing transceiver, receiver or transmitter applications, and enhances signal integrity. The following description is presented to enable one of ordinary skill in the art to make and use the invention and is provided in the context of a patent application and its requirements.

This application defines a unique pinout feature for a class of integrated circuits (ICs) known as digital line transceiver. Broadly a transceiver is any device that can both transmit and receive communication signals. In an embodiment, a transceiver could be an IC containing two independent signal paths wherein each path employs a differential input and a differential output (e.g. with four pins). One path drives a differential signal onto a low impedance differential transmission line (the transmit side), while the second receives a similar differential signal from a separate differential transmission line.

Typically, ICs of this class are packaged in multi-pin, square packages wherein equal numbers of electrical connections reside on all four sides of the package. Several factors influence how the pins of the respective differential input and output pairs are assigned. These include optimizing data flow patterns, minimizing PC board space requirements, facilitating the use of equal line lengths, minimizing transmission line impedance discontinuities and electromagnetic crosstalk to assure signal integrity. The last two become increasingly important as the application date rate increases.

To facilitate testing of the signal path up to but not beyond the transceiver, it is often necessary to include a loopback feature. This feature allows the received signal to be temporarily "transmitted" back by the same transceiver.

Accordingly, an embodiment of the present invention provides a fully differential 2×2 cross-point switch having dual configuration of data flow. This cross-point switch is a single chip architecture with pinout that can be used to satisfy either application.

In a preferred implementation, the present invention is configured so as to have a differential signal pair set at each corner of the integrated circuit package. For instance, in any one configuration, a total of 8 corner pins results. Each corner pair comprises one corner pin from each adjacent side, such that no two corner pins are from the same side of the chip. The resulting paired corner sets then each comprise two adjacent corner pins. The paired corner sets are then determined to be one of differential inputs or one of differential outputs, in relation to a truth table and pinout of the present invention.

In operation, the input—output pin configuration is especially important in smaller 16, 24 and 32-pin quad packages, and the pinout of the present invention provides optimized noise isolation between inputs and outputs in relation to the spatial distance between them. The differential corner pairs (i.e., between true and complement signals) have an increased spatial distance to allow control of the differential impedance to optimize for improved performance due to line impedance matching and reduced signal crosstalk. Non corner package pins, pins along the side of a package, have reduced lead pitch which will reduce the differential line impedance and increased unwanted signal crosstalk. This becomes a signal integrity problem as packages advance and become smaller.

FIG. 1 shows a functional block diagram 100 of a representative programmable circuit, in accordance with the above-disclosed, implementation of the present invention. From FIG. 1, select inputs (SEL0 and SEL0) (110, 120) are the selectable inputs which select the differential signal inputs (IN0 and IN1) (130, 140) in accordance with a selectable input logic at 170 and 180. Element 190 is VT0 which is an input termination center-tap such that an input terminates to this pin. Elements 191 and 192 are the differential output pairs which are preferably buffered output copy of the select input signal, determined in accordance with the selectable signal path. The selectable signal path determines the output pairs in accordance with a truth table (FIG. 2) and pinout configuration (FIG. 4). R50 is representative of resistors having 50 ohms, in a preferred implementation.

FIG. 2 represents a truth table 200 in accordance with an implementation of the present invention. The truth table 200 presents a relational aspect of the interconnecting logic of the switch of the present invention, which is used in conjunction with the pinout of FIG. 3.

Figure 3:
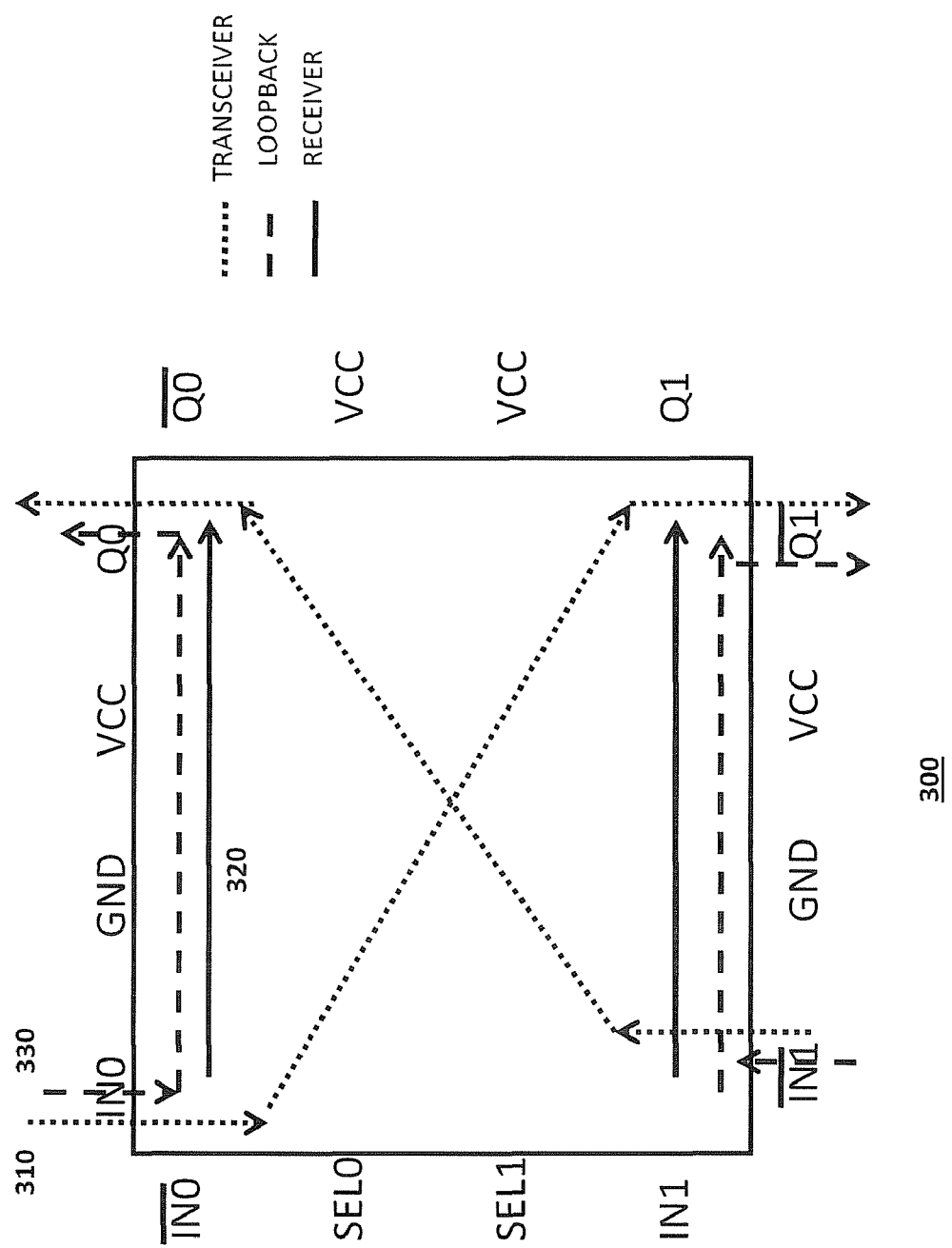
FIG. 3 is an operational diagram of the pin layout in accordance with an embodiment of the present invention.

In accordance with the pinout configuration of FIG. 3, at 320, in an operational mode of the present invention as a dual receiver, IN1 is connected with Q1 and IN0 is connected with Q0, such that when the differential output pairs are predetermined in accordance with the selectable input logic to yield differential outputs of Q1/Q0 of IN1/IN0 when SEL0 is "low" and SEL1 is "high."

Furthermore, in accordance with the pinout configuration of FIG. 3, at 310, in an operational mode of the present invention as a transceiver, IN1 is connected with Q0 and IN0 is connected with Q1, such that when the differential output pairs are predetermined in accordance with the selectable input logic to yield differential outputs of Q1/Q0 of IN0/IN1 when SEL0 is "high" and SEL1 is "low." The differential pairs are diametrically opposed to one another in the configuration.

Additionally, in accordance with the pinout configuration of FIG. 3, at 330, in an operational mode of the present invention as a loopback test mode, IN0 is looped back to Q0 and IN1 is looped back to Q1.

This package pinout implementation along with a crosspoint switch, allows one device to have a data flow in opposite directions for a transceiver function, and have data flow in the same direction for the dual receive mode. Along with this device flexibility, improved signal integrity is achieved. The package pinout implementation can also be achieved with dedicated, non programmable, receiver and transmitters.

Although this invention has been described in terms of certain embodiments, other embodiments that are apparent to those of ordinary skill in the art are also within the scope of this invention, as defined in the claims that follow.

What is claimed is:

1. A single integrated circuit chip capable of dual configuration of data flow and operable in a plurality of operational modes comprising:
   eight corner pins, wherein the eight corner pins comprise four corner pair sets, wherein each of the four corner pair sets comprises one corner pin from each adjacent side, such that no two corner pair sets are from the same side of the circuit: wherein each of the four corner pair sets comprise two adjacent corner pins, each of the four corner pair sets comprising a differential input and a differential output in relation to a truth table and pinout.

2. The circuit of claim 1, wherein a circuit configuration can be a cross-point configuration wherein the circuit provides for noise isolation and impedance control between the differential input and the differential output.

3. The circuit of claim 1, wherein each paired corner set is further separated by a predetermined distance as determined in relation to a difference between true and complement signals to provide a controlled impedance and improve noise isolation between the differential input and the differential output.

4. The circuit of claim 3, wherein the switch operates as a dual receiver where a first paired corner set comprising differential inputs and a second paired corner set differential outputs, and IN1 is connected with Q1 and IN0 is connected with Q0.

5. The circuit of claim 4, wherein the first paired corner set is positioned in an upper left quadrant and the second cornered pair set is positioned in a lower right quadrant.

6. The circuit of claim 4, wherein differential output pairs are predetermined in accordance with the selectable input logic to yield differential outputs of Q1/Q0 of IN1/IN0 when SEL0 is "low" and SEL1 is "high."

7. The circuit of claim 3, wherein the circuit operates as a transceiver with loopback feature where an first paired corner set comprising differential inputs and a second paired corner set comprising differential outputs, the first paired corner set being diametrically opposed to the second paired corner set, and IN1 is connected with Q0 and IN0 is connected with Q1.

8. The circuit of claim 7, wherein the first paired corner set is positioned in an upper left quadrant and the second cornered pair set is positioned in a lower right quadrant.

9. The circuit of claim 7, wherein differential output pairs are predetermined in accordance with a selectable input logic to yield differential outputs of Q1/Q0 of IN0/IN1 when SEL0 is "high" and SEL1 is "low."

10. The circuit of claim 3, wherein differential output pairs are predetermined in accordance with a selectable input logic to yield differential outputs of one of Q1/Q0 of IN1/IN0 when SEL0 is "high" and SEL1 is "low" and Q1/Q0 of IN1/IN0 when SEL0 is "low" and SEL1 is "high" in relation to an operational mode of the circuit.

11. The circuit of claim 10, wherein the circuit is operable as a dual-receiver wherein the differential output pairs are predetermined in accordance with a selectable input logic to yield differential outputs of Q1/Q0 of IN1/IN0 when SEL0 is "low" and SEL1 is "high".

12. The circuit of claim 10, wherein the circuit is operable as a transceiver with feedback loop so as to receive two inputs wherein data flow corresponds to receiving the two inputs at a first paired corner set and switching received data to a second paired corner set diametrically opposed to the first paired corner set.

13. The circuit of claim 10, wherein the circuit is operable in operational modes as a dual-receiver and as a transceiver with feedback loop so as to receive two inputs wherein data flow of the receiver corresponds to receiving the two inputs at a first paired corner set and switching received data to a second paired corner set and data flow of the transceiver corresponds to receiving the two inputs at a third paired corner set and switching received data to a fourth paired corner set diametrically opposed to the third paired corner set and providing the loopback feature.

* * * * *